(12) United States Patent
Ditlow et al.

(10) Patent No.: US 6,301,690 B1
(45) Date of Patent: Oct. 9, 2001

(54) METHOD TO IMPROVE INTEGRATED CIRCUIT DEFECT LIMITED YIELD

(75) Inventors: Gary S. Ditlow, Garrison, NY (US); Daria R. Dooling, Huntington, VT (US); David E. Moran, South Burlington, VT (US); Richard L. Moore, Colchester, VT (US); Gustavo E. Tellez, Cornwall on Hudson, NY (US); Ralph J. Williams, Essex Junction; Thomas W. Wilkins, Shelburne, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/294,495

(22) Filed: Jul. 12, 1999

(51) Int. Cl.[7] ........................................ G06F 17/50
(52) U.S. Cl. ........................................................ 716/5
(58) Field of Search ................................. 716/1, 4, 5, 19

(56) References Cited

U.S. PATENT DOCUMENTS

| | | | |
|---|---|---|---|
| 2,772,501 | 12/1956 | Malcolm | 156/223 |
| 2,938,939 | 5/1960 | Malcolm | 174/255 |
| 4,195,195 | 3/1980 | de Miranda et al. | 174/254 |
| 5,598,341 | * 1/1997 | Ling et al. | 716/19 |
| 5,737,580 | 4/1998 | Hathaway et al. | 716/12 |
| 6,210,983 | * 4/2001 | Atchinson et al. | 716/4 |

FOREIGN PATENT DOCUMENTS 24 29 978  1/1976  (DE) ...................................... 361/400

* cited by examiner

Primary Examiner—Trong Phan
(74) Attorney, Agent, or Firm—Connolly Bove Lodge & Hutz

(57) ABSTRACT

A method for manufacturing an integrated circuit having improved defect-limited yield. Each conductor on the integrated circuit is represented as an electrical element of a network, having branch voltages and currents. The width of the conductor is advantageously selected to have the minimum width necessary to produce signal levels that have sufficient noise margins. An integrated circuit conductive grid is thus realized having a reduced cross sectional area along a portion of various conductor element lengths, to reduce the risk that particles produced during manufacturing will result in bridging of adjacent conductor elements.

14 Claims, 5 Drawing Sheets

METHOD TO IMPROVE INTEGRATED CIRCUIT DEFECT LIMITED YIELD

FIELD OF THE INVENTION

The present invention generally relates to integrated circuit (IC) manufacturing yield, and more particularly to methods to improve IC defect-limited yield (DLY) by reducing particle-induced defects while accounting for IC physical design and IC manufacturing processes.

BACKGROUND OF THE INVENTION

The yield of a manufacturing process is the ratio of the product that meets or exceeds its functional and performance specifications to the total product made. Regarding integrated circuit (IC) yield, two types are defined: defect-limited yield (DLY) and circuit-limited yield (CLY). DLY is the ratio of the product that meets functional performance specification to the total product made. CLY is the ratio of the product that meets or exceeds functional performance specification to the total product made.

Particle defects reduce DLY and CLY. If a particle defect prevents the IC from functioning, DLY is reduced. If a particle defect only retards performance, then CLY is reduced.

An example of a particle defect is when a conductive particle falls between two adjacent wires on an IC, and the particle is of sufficient size to contact both wires. Such an occurrence can cause a short circuit in the IC, preventing the IC from functioning and reducing DLY.

The probability of a short circuit caused by a particle defect is proportional to the ratio of the area occupied by the circuit wiring to the total area of the IC. Thus, reducing wiring area reduces the probability of a short circuit caused by a particle defect improving DLY.

Reducing the width of individual conductors within an IC is one way of reducing overall wiring area. However, reducing the width of a conductor increases its resistance, with undesirable effects on associated voltages and IC electrical performance. Further, in a multilayer integrated circuit, reliably interconnecting the wiring layers through vias requires that the conductor have a width the size of the via opening, thereby limiting the reduction in size.

Nothing in the prior art appears to include a method of reducing wiring area without reducing IC electrical performance, and more specifically to address the problem of reduction in DLY due to short circuits caused by particle defects.

SUMMARY OF THE INVENTION

A method is provided for improving the defect-limited yield for integrated circuits. The method includes selectively reducing the wiring area of a set of conductors on an integrated circuit, to lower the probability of a short circuit occurring due to particle defects. The method reduces the wiring area by reducing the individual conductor widths on the integrated circuit while maintaining a larger width at the ends of each individual conductor so that they may be connected to off-chip connections, or to interlayer vias.

In accordance with the invention, a method is provided to determine the size of conductors which will improve the defect-limited yield, while maintaining signal voltages and currents to be carried by the conductors within an allowed variation. Each conductor may be represented as an electrical element of a network, the end points of the conductor representing nodes within the network. The voltages at each end of a conductor, and current through the conductor, is compared with a reference voltage and current, representing the minimum value which produces acceptable circuit responses. The reference voltages and currents are selected to provide an acceptable noise margin for the circuit to function. The width of each conductor is varied over a portion thereof, and a final width is selected which produces voltages and currents equal to the reference voltages and current.

The method according to the invention may be implemented as a series of computer executable instructions which determines from the various conductor lengths and widths various nodal voltages. The computer executable instructions compare the computed nodal voltages at each end of a conductor with a critical value of voltage. The value of the conductance of each conductor is iteratively decreased until the resultant conductance values produce the critical value of voltages. The effective width of each conductor may then be calculated by additional executable instructions for the determined conductances.

The invention also provides a conductor grid for an integrated circuit having individual circuit conductors having at least along a portion thereof a minimum width which improves defect yield due to particle contamination. The reduced cross section for each conductor element is established by determining a minimum voltage across the circuit conductor necessary for adequate noise immunity for any signal carried by the conductor.

DESCRIPTION OF THE PREFERRED EMBODIMENT

Integrated circuit manufacturing processes have a certain yield that is unique to each process. In the manufacturing of integrated circuits, there are two types of yield, one being a defect-limited yield, and the other being a circuit limited yield. The defect-limited yield is the ratio of the product that meets functional specification to the total product made. The circuit limited yield is defined as the ratio of the product that meets or exceeds functional performance specifications to the total product made.

There are many process defects which can result in particle defects that affect the physical and functional properties of the integrated circuit. Particle defects prevent the integrated circuit from functioning, reducing the defect-limited yield and also retard the performance of the integrated circuit, reducing the circuit limited yield as well.

Figure 1:
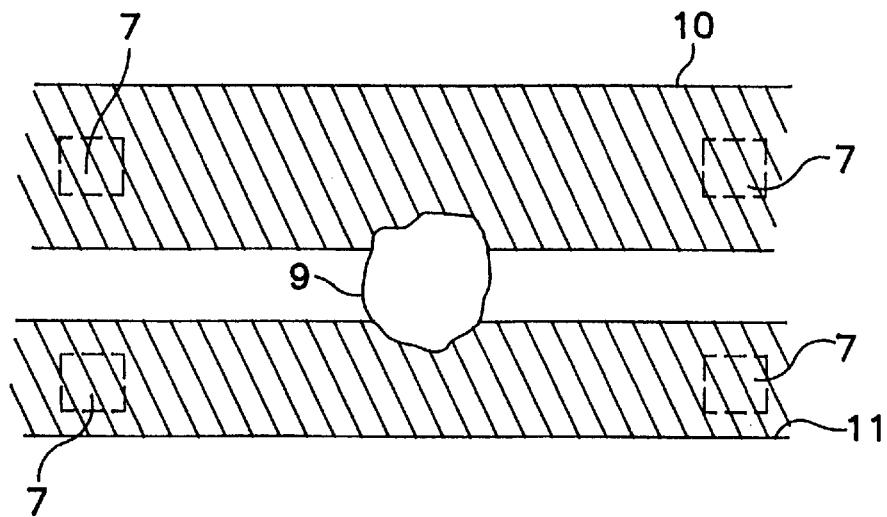
FIG. 1 illustrates a conventional pair of integrated circuit conductors which have a particle defect.

FIG. 1 illustrates one type of particle defect, which results in a short circuit between two adjacent conductors carrying different signal voltages in a layer of an integrated circuit terminating in vias 7. These defects are caused by a particle 9 of conductive material produced during the manufacturing process bridging the two conductors 10 and 11, so as to result in a bridging fault.

The probability of the occurrence of a particle defect using a bridging fault is proportional of the ratio of the area occupied by the circuit wiring and the total area of the integrated circuit which can be represented as follows:

$P$=wiring area/total area where wiring area equals length*width of each conductor.

Reducing the wiring area thereby reduces the probability of the occurrence of a particle defect which bridges two conductors, therefore improving the defect-limited yield. The wiring of an integrated circuit layer carries one of three basic types of signals; power supply voltage, clock signals, and data/control signals. The power supply voltage, clock signals, and data/control signals enter the integrated circuit through a C4 contact, travel through a series of metal conductor elements and vias, interconnecting different layers and terminate on an active component such as a transistor. These wiring networks return through an active component to a ground circuit which is also a series of metal conductors, interconnected by vias and terminating on a C4 contact.

Bridging effects which reduce DLY can also be reduced for devices on the integrated circuit as well as conductor grids. For instance, shortening the metal connections for the source and drain of a transistor improves particle defect yield by effectively reducing the opportunity for bridging effects.

Figure 2:
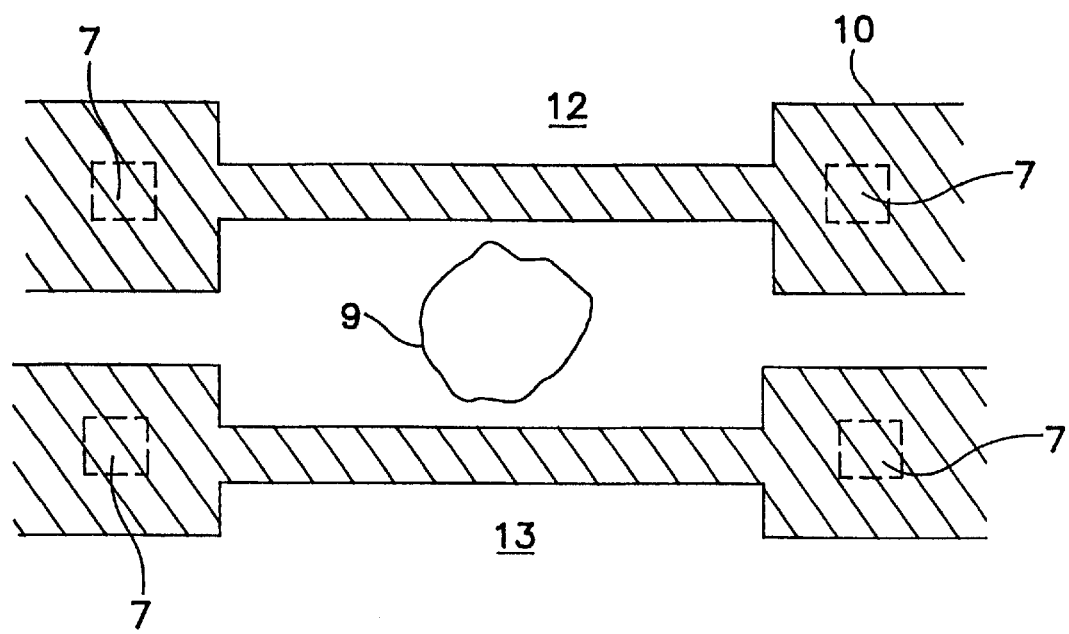
FIG. 2 illustrates the pair of conductors modified in accordance with one embodiment of the invention.

Reducing the effective wiring area, such as is shown in FIG. 2, results in reduced particle defects. The reduced width along portions 12 and 13, however, changes the resistance of each of the conductors 10, 11, as is evident from the following:

$R = \rho * \text{length}/(\text{thickness}*\text{width})$;

where p is the resistivity of metalization.

Increases in resistance are undesirable in that they can reach a level where power supply voltage, clock levels and data control signal voltages have reduced noise immunity with respect to the power supply circuit or ground circuit voltage.

Accordingly, while reducing the width of the conductor elements reduces particle defect bridging faults, an increased conductor resistance can be a problem, and is ultimately a limiting condition on reducing the width of these conductors.

The present invention seeks to determine an optimum wiring area without seriously degrading signal voltages carried by the wiring layers. As FIG. 2 illustrates, a narrowed width may be provided along an interior portion of the conductor element. The narrow portions 12 and 13 may be formed by trimming the full width of the conductor W to a narrower width W', over an interior portion thereof, away from the ends. In this way, the ends have a full width which may terminate on a via, or conductor pad providing a reliable connection to the via and/or conductor pad.

Figure 3A:
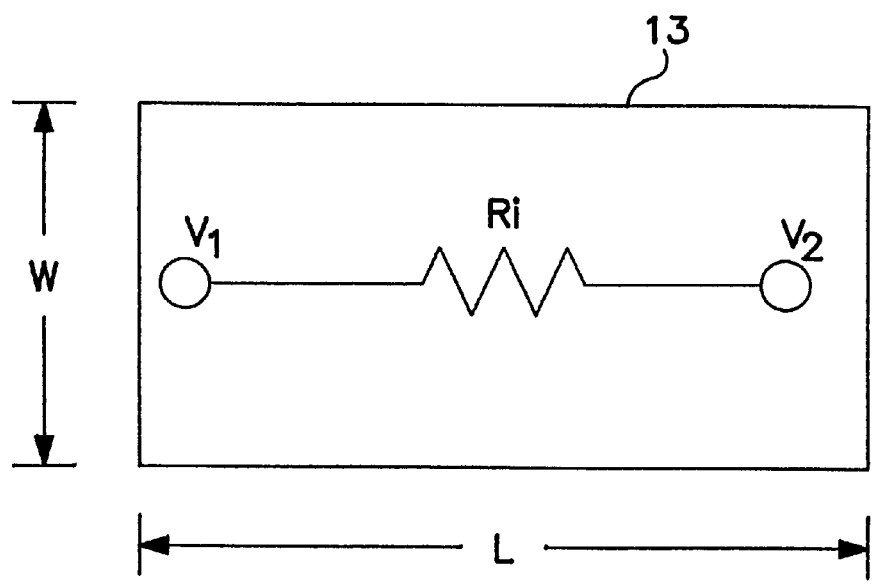
FIG. 3 is a top view of a single conductor.
Figure 3B:
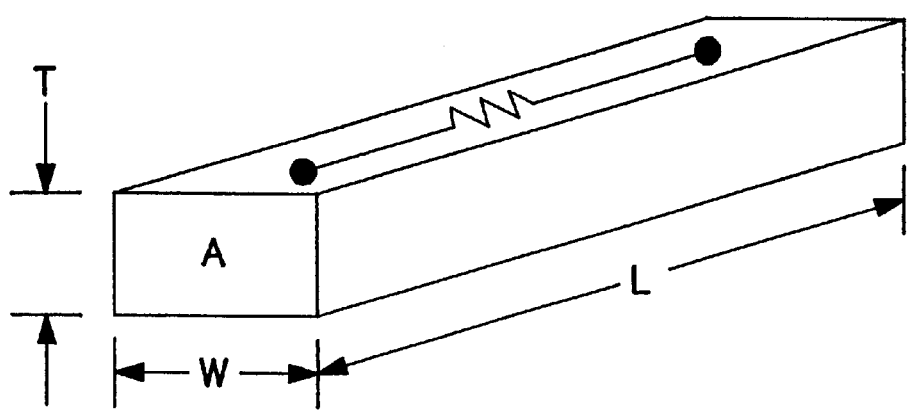
Figure 4:
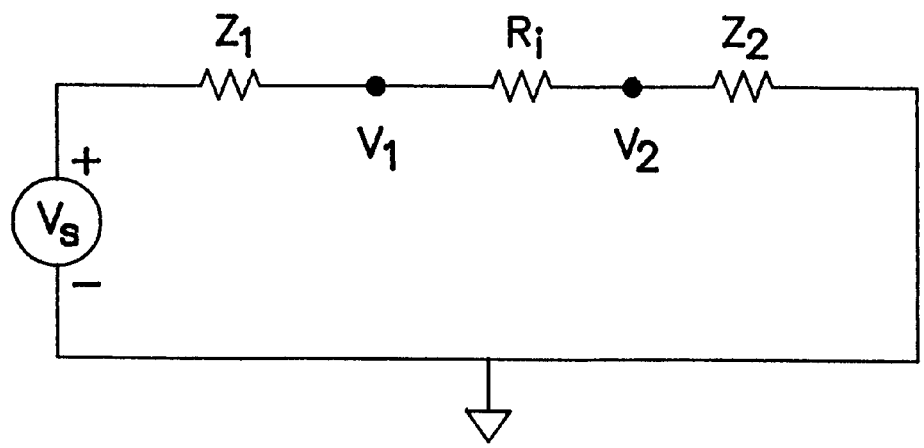
FIG. 4 illustrates an equivalent circuit showing the derivation of termination voltages for the conductor of FIG. 3.

FIG. 3 illustrates the basic structure of a conductor element, having a width W, length L, and which has termination voltages $V_1$ and $V_2$. FIG. 4 illustrates an equivalent circuit for the conductor element, having an internal resistance $R_i$ connected in a generalized circuit including an input impedance $Z_1$ and output impedance $Z_2$.

The voltages $V_1$ and $V_2$ across the resistance element $R_i$ of the conductor element 13 may be calculated according to the following:

$$V_1 = V_s - IZ_1 - V_2$$

$$V_2 = IZ_2 = \frac{V_s Z_2}{Z_1 + R_i + Z_2} = \frac{V_s Z_2}{Z_1 + \frac{\rho L}{TW} + Z_2}$$

where $\rho$ is the resistivity of metal, and T is the conductor thickness.

Figure 5:
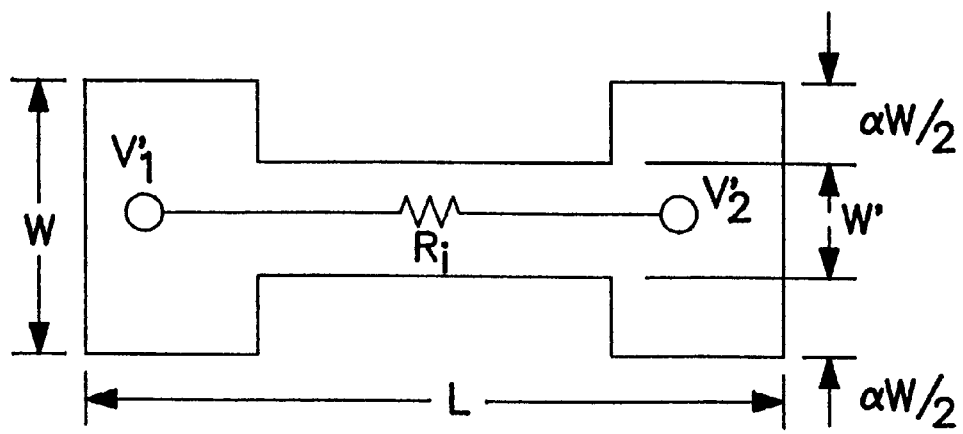
FIG. 5 illustrates a determination of an optimum width for the conductor which reduces the conductor surface area.

If the width of the conductor is reduced in accordance with the present invention, a profile as shown in FIG. 5 is obtained, and the electrical properties of the resulting conductor element can be described by:

$$W' = W - 2\left(\frac{\alpha w}{2}\right) = W - \alpha W = W(1 - \alpha) \quad (4A)$$

$$R' = \frac{\rho L}{TW'} = \frac{\rho L}{TW(1 - \alpha)} \quad (4B)$$

$$V'_2 = \frac{V_s Z_2}{Z_1 + R' + Z_2} = \frac{V_s Z_2}{Z_1 + Z_2 + \frac{\rho L}{TW(1-\alpha)}} = \frac{V_s Z_2 TW(1-\alpha)}{(Z_1 + Z_2)TW(1-\alpha) + \rho L} \quad (4C)$$

The representations of the conductor width in equations 4(A), 4(B) and 4(C) permit a parameter $\alpha$ to be optimized, so that the width W' of the interior portion of the conductor may be reduced to a minimum value. This minimum value will depend upon establishing a critical voltage $V_{CRIT}$ for $V_{2'}$. The $V_{CRIT}$ voltage will be large enough to include a sufficient noise margin for the conductor, such that active circuits connected to the conductor are able to reliably respond to any signals or voltages applied to the conductor element. Defining the parameter $\alpha$, such that $V_{2'} = V_{CRIT}$, permits a calculation for $\alpha$ such that the parameter $\alpha$ may be represented as:

$$\alpha = 1 - \frac{\rho L}{TW} \cdot \frac{V_{CRIT}}{V_s Z_2 - V_{CRIT}(Z_1 + Z_2)}$$

By optimizing $\alpha$, the particle defect which produces a full condition is reduced, as it requires the larger particles to bridge the adjacent interior portions of two conductors in a layer of an integrated circuit.

Figure 6:
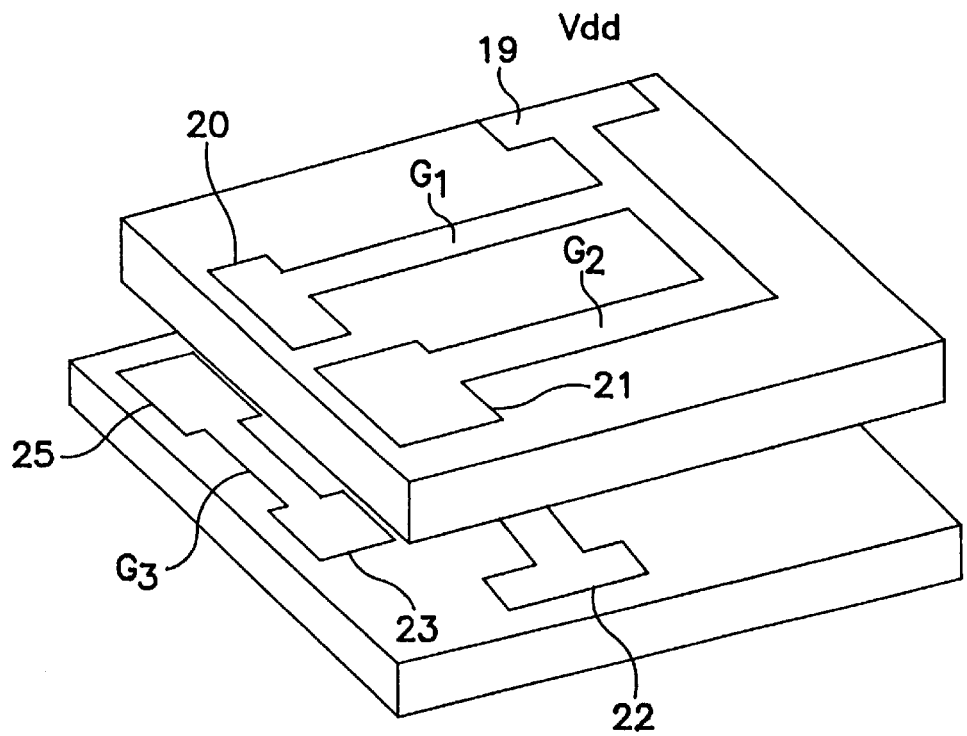
FIG. 6 illustrates a conductor grid for which a width calculation is to be made.

The foregoing analysis is applicable to large scale conductor grids, which may have millions of such conductor elements connected together, through vias, C4 contacts, and various active circuit components on the integrated circuit. The applicability of the foregoing analysis for a single conductor element can be demonstrated for an electrical network comprising all of the electrical conductor elements making up a conductor grid. FIG. 6 is a simplified example of one such conductor network beginning with a C4 connection 19, on a layer of an integrated circuit. The conductor G1 starts at the C4 connection 19, and terminates on a via 20. A similar conductor G2 is shown, also starting at the C4 connection 19 and terminating at an active circuit element 21. Via 20 is connected through to a circuit element G3, having an end 25. Circuit element G3 is in turn terminated on the active circuit element 23.

Figure 7:
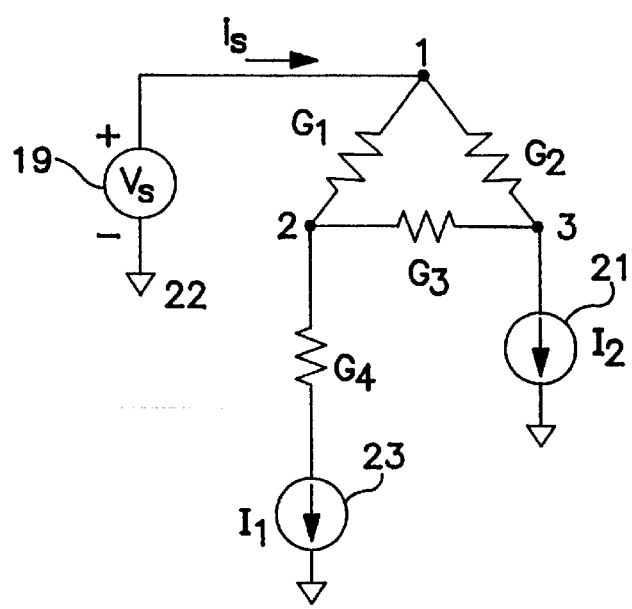
FIG. 7 illustrates the resistive network formed from the conductors of FIG. 6.

A calculation for the width of each of conductor elements G1, G2 and G3 is provided by reducing the conductor grid in which G1, G2 and G3 lie to an equivalent resistive network shown in FIG. 7. FIG. 7 illustrates the equivalent resistive network which is formed by the metalization pattern shown in FIG. 6. Each of the active elements 21 and 23 are represented by current sources having current I1 and I2.

Voltages at circuit points 1, 2 and 3 can be derived, based on the input voltage Vdd, source current $i_e$, and values for currents I1 and I2. Applying a nodal analysis to the resistive network represented by FIG. 7, produces the following equations in nodal form:

$$v_1 : (v_1 - v_2)G_1 + (v_1 - v_3)G_2 - i_s = 0$$
$$v_2 : (v_2 - v_1)G_1 + (v_2 - v_3)G_3 + (v_2 - v_4)G_4 = 0$$
$$v_3 : (v_3 - v_1)G_2 + (v_3 - v_2)G_3 + I_2 = 0$$
$$v_4 : (v_4 - v_2)G_4 + I_1 = 0$$
$$i_s : v_s - v_1 = 0$$

These equations can be in matrix form represented as follows:

$$\begin{bmatrix} G_1+G_2 & -G_1 & -G_2 & 0 & -1 \\ -G_1 & -G_1+G_1+G_4 & -G_3 & -G_4 & 0 \\ -G_2 & -G_3 & G_2+G_1 & 0 & 0 \\ 0 & -G_4 & 0 & G_4 & 0 \\ -1 & 0 & 0 & 0 & 0 \end{bmatrix} \begin{bmatrix} v_1 \\ v_2 \\ v_3 \\ v_4 \\ i_s \end{bmatrix} = \begin{bmatrix} 0 \\ 0 \\ I_2 \\ -I_1 \\ -V_s \end{bmatrix}$$

$$\begin{bmatrix} 2 & -1 & -1 & 0 & -1 \\ -1 & 3 & -1 & -1 & 0 \\ -1 & -1 & 2 & 0 & 0 \\ 0 & -1 & 0 & 1 & 0 \\ -1 & 0 & 0 & 0 & 0 \end{bmatrix} \begin{bmatrix} v_1 \\ v_2 \\ v_3 \\ v_4 \\ i_s \end{bmatrix} = \begin{bmatrix} 0 \\ 0 \\ -2 \\ -1 \\ -2.5 \end{bmatrix} \Rightarrow \begin{bmatrix} v_1 \\ v_2 \\ v_3 \\ v_4 \\ i_s \end{bmatrix} = \begin{bmatrix} 2.5 \\ 1.1667 \\ 0.833 \\ 0.1667 \\ 3.0 \end{bmatrix}$$

The modified nodal equation, represented by the matrix of a conventional integrated circuit, would be of the order of 6 million by 6 million. However, as the simplified example of FIG. 6 illustrates, the equation can be solved for each of the values for V, $V_2$, $V_3$, $V_4$ and $i_e$ using nominal values for each of the conductances $G_1$, $G_2$, $G_3$ and $G_4$.

The calculated values of $V_1$, $V_2$, $V_3$, $V_4$ and $I_s$ may be compared with a set of critical values, and if they are greater than the critical values, conductance values for $G_1$, $G_2$, $G_3$ and $G_4$ may be decreased since narrowing a wire width increases the resistance and decreases the conductance.

The process of increasing the values of $G_1$, $G_2$ and $G_3$ is iterative. In a preferred embodiment of the invention, the values of $G_1$, $G_2$ and $G_3$ are each incrementally decreased. Those layers of conductors having a wider conductor width will have a width reduction proportional to the width reduction in other layers having a narrower conductor width. Each iterative increase in conductance values results in a new calculation of $V_1$, $V_2$, $V_3$, $V_4$ and $I_s$. Once these values have reached $V_{CRIT}$. The value of α determines the width and therefore the conductance of the perturbed values of $G_1$, $G_2$, $G_3$, $G_4$.

Figure 8:
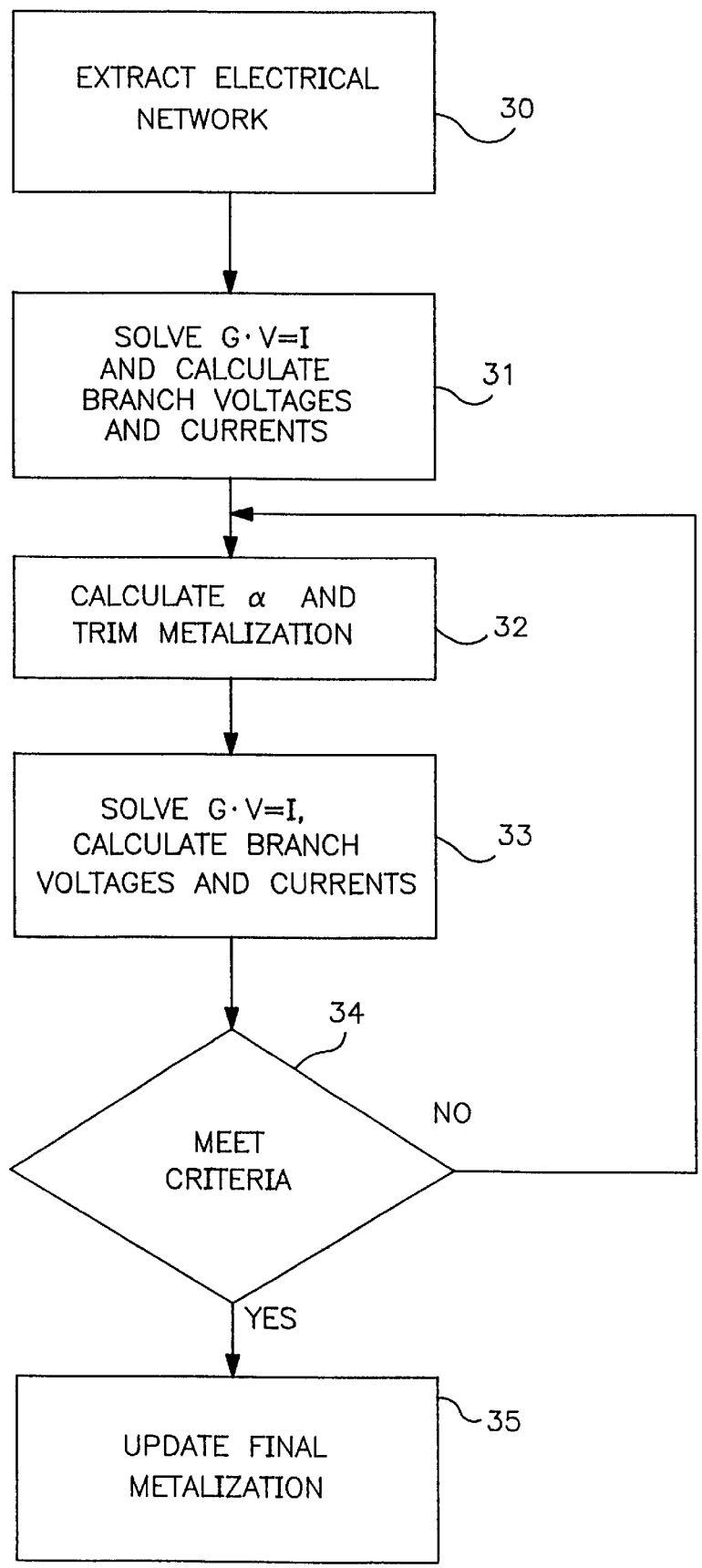
FIG. 8 illustrates the computer implemented process for calculating the respective widths of each conductor element.

More generalized flow chart for steps in a computer program for determining the values of α from an electrical network analysis as shown in FIG. 7 is represented by FIG. 8.

Turning now to FIG. 8, there is shown a first step in a computer implemented process for performing the optimization of metal element widths. Step 30 illustrates the step of entering the parameters of the electrical network of FIG. 7 in the computer. In step 31, a conductivity matrix is formed as above, and solved as GV=I to obtain the various conductances in $G_1$–$G_n$ for a network of n conductor elements.

Following the determination of the matrix equation, GV=I, wherein the various branch voltages and currents are determined, the value of α is selected in step 32 in which to trim the width of each conductive element. The value of α is selected iteratively, and the matrix equation is again solved in step 33, with new values of conductance based on the new value of α, and each of the branch voltages is in turn compared with a critical branch current and critical voltage in step 34. In the event that the voltages and currents remain above the critical voltages and currents, a further calculation of α is performed in step 32 to further trim the width of the metalization segment. The process is repeated until such time as an α value is determined, which produces branch voltages and currents which are substantially equal to the reference voltages and currents. The reference voltages and currents are, in turn, determined based on a necessary noise margin which is known to the designer.

The final metalization parameters, including α, are updated in step 35, for use in a circuit simulation, or to provide a data file for the semiconductor manufacturing process.

The foregoing steps of solving a matrix equation for the branch voltages and currents and subsequently trimming the width of each conductor segment to derive a conductive width which meets direct criteria of minimum size, while maintaining noise margins may be implemented as part of computer design process. The steps may all be stored on a computer readable medium, which requires that the original electrical network 30 be entered, representing the various elements in the nodal analysis. Once entered, execution may commence to derive a list of metalization lengths and widths meeting the criteria of a minimum width.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. In a manufacture of integrated circuits, a method for determining the size of conductors which improves the defective limited yield while maintaining signal voltage within an allowed variation comprising:
   representing each conductor as an electrical element of a network having currents and voltages determined by the width of said conductor;
   varying the area of each conductor and comparing said voltages and currents with a reference voltage and current; and
   selecting a minimum area for said conductor which produces a voltage and current above said reference voltage and current.

2. The method of claim 1 wherein said conductor width is varied over a portion of said conductor which does not terminate on a via connecting said conductor to a conductor on another layer of said integrated circuit.

3. The method of claim 1 wherein said network is represented by a matrix equation having as elements the conductance of each conductor expressed as a function of its width, each voltage and current produced by said network, and the reference values of each of said voltages and currents produced by said network.

4. The method of claim 3 wherein said widths of said conductor is varied incrementally, and the value of said voltages and currents are compared to said reference voltage and currents each time said width is varied.

5. A method for improving defect-limited yield of an integrated circuit manufacturing process comprising:

defining a network of conductances representing conductors in a wiring plane of said integrated circuit;

representing said network of conductances in a matrix with respective terminating voltages for said conductors and currents in said conductors which represent operating voltages and currents for said integrate circuits;

comparing said operating voltages and operating currents with a reference operating voltage and operating currents; and reducing the width of each conductance in predetermined increments until said operating voltages and currents are substantially equal to said reference operating voltages and operating currents.

6. The method according to claim 5 wherein said width of said conductances are reduced over a portion of said conductances length.

7. A conductor grid for an integrated circuit comprising:

a plurality of circuit conductors forming a network with a plurality of circuit components, said circuit conductors terminating in vias extending to an adjacent layer of said integrate circuit, and terminating on a circuit component or an external circuit connection;

each of said conductors having a reduced cross sectional area along a portion of its length from a cross section at its ends, thereby lowering the defect yield due to particle contamination.

8. The conductor grid according to claim 7 wherein said reduced cross section is established at a level which produces a voltage across said circuit conductors which is a predetermined minimum.

9. The conductor grid according to claim 7 wherein said reduced cross section is determined by comparing voltages and currents of a resistive network formed by said plurality of circuit conductors with a predetermined set of voltages and currents.

10. The conductor grid according to claim 8 wherein said voltage across said circuit conductors is selected to provide an acceptable noise margin.

11. A computer readable medium having stored thereon instructions for executing the method for determining the width of segments of a conductor grid of an integrated circuit comprising:

storing network information which includes a plurality of conductances representing said conductor segments of said conductor grid as a network matrix along with respective terminating voltages and currents of said conductor segments;

incrementally increasing the value of said conductances;

comparing said voltages and currents of said matrix for each incremental increase with a reference voltage and current for each of said terminating voltages and currents; and determining a width for each of said conductors when said voltages and currents are substantially equal to said reference voltages and currents.

12. The computer readable medium of claim 11 wherein said instruction for determining said conductor width reduces the width of said conductor along an interior portion of said conductor segment length.

13. The computer readable medium according to claim 11 wherein said reference voltages and currents are selected to provide operating voltages and currents for said integrated circuit having a predetermined noise margin.

14. The computer readable medium according to claim 11 wherein said value of conductances is incremented by decreasing a previously determined width of said conductors.

* * * * *